(12) United States Patent
Vittal Prabhu et al.

(10) Patent No.: US 11,061,762 B2
(45) Date of Patent: Jul. 13, 2021

(54) MEMORY PROGRAMMING TECHNIQUES

(71) Applicant: Intel Corporation, Santa Clara, CA (US)

(72) Inventors: Naveen Prabhu Vittal Prabhu, Folsom, CA (US); Bharat M. Pathak, Folsom, CA (US); Aliasgar S. Madraswala, Folsom, CA (US); Yogesh B. Wakchaure, Folsom, CA (US); Violante Moschiano, Bacoli (IT); Walter Di Francesco, Silvi Marina (IT); Michele Incarnati, Avezzano (IT); Antonino Giuseppe La Spina, Ramacca (IT)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 16/267,323

(22) Filed: Feb. 4, 2019

(65) Prior Publication Data

US 2020/0250028 A1    Aug. 6, 2020

(51) Int. Cl.
*G11C 29/00* (2006.01)
*G06F 11/10* (2006.01)
(Continued)

(52) U.S. Cl.
CPC ........ *G06F 11/1048* (2013.01); *G06F 11/076* (2013.01); *G06F 11/1072* (2013.01);
(Continued)

(58) Field of Classification Search
CPC ............... G06F 11/076; G06F 11/1048; G06F 11/1072; G11C 11/5628; G11C 16/10;
(Continued)

(56) References Cited

U.S. PATENT DOCUMENTS 8,995,197 B1 * 3/2015 Steiner ................. G11C 29/021
    365/185.19
9,330,767 B1 * 5/2016 Steiner ................. G11C 16/349
(Continued)

OTHER PUBLICATIONS

Cai, Yu. et al., "Threshold Voltage Distribution in MLC NAND Flash Memory: Characterization, Analysis, and Modeling", DSSC, Department of Electrical and Computer Engineering, Carnegie Mellon University, Pittsburgh, PA, LSI Corporation, 1110 American Parkway NE, Allentown, PA, Mar. 2013, 6 pages.
(Continued)

*Primary Examiner* — Albert Decady
*Assistant Examiner* — Enamul M Kabir
(74) *Attorney, Agent, or Firm* — Compass IP Law PC (57) ABSTRACT

A memory device that has been programmed to store a single bit or multiple bits can perform a determination of a number of threshold voltages in one or more threshold voltage level regions. Based on the number of threshold voltages meeting or exceeding a threshold level, a page of bits can be read and if the bit error rate of the page of bits is below a threshold rate, the page of bits can be stored in the cells together with other bits stored in the cells and a provided additional page of bits. However, if the bit error rate of the page of bits is at or above the threshold rate, then the bit or bits stored in the cells can be error corrected and stored together with a provided additional page of bits.

19 Claims, 7 Drawing Sheets

(51) Int. Cl.
*G11C 29/44* (2006.01)
*G11C 29/52* (2006.01)
*G11C 11/56* (2006.01)
*G06F 11/07* (2006.01)
*G11C 16/10* (2006.01)
G11C 29/04 (2006.01)

(52) U.S. Cl.
CPC .......... *G11C 11/5628* (2013.01); *G11C 16/10* (2013.01); *G11C 29/44* (2013.01); *G11C 29/52* (2013.01); *G11C 2029/0411* (2013.01); *G11C 2211/5621* (2013.01)

(58) Field of Classification Search
CPC .... G11C 2029/0411; G11C 2211/5621; G11C 29/44; G11C 29/52
See application file for complete search history.

(56) References Cited

U.S. PATENT DOCUMENTS

| Patent/Pub. No. | Date | Inventor | Classification |
|---|---|---|---|
| 9,563,502 B1* | 2/2017 | Alhussien | G06F 11/1048 |
| 9,619,321 B1* | 4/2017 | Haratsch | G06F 3/064 |
| 9,703,494 B1* | 7/2017 | Rajwade | G11C 16/0483 |
| 10,109,361 B1* | 10/2018 | Khakifirooz | G11C 11/5628 |
| 10,366,770 B1* | 7/2019 | Kurosawa | G11C 11/5628 |
| 2005/0083735 A1* | 4/2005 | Chen | G11C 16/10 365/185.17 |
| 2007/0201274 A1* | 8/2007 | Yu | G11C 11/5621 365/185.09 |
| 2008/0094914 A1* | 4/2008 | Park | G11C 16/3495 365/185.24 |
| 2008/0137415 A1* | 6/2008 | Lee | G11C 11/5628 365/185.03 |
| 2009/0109748 A1* | 4/2009 | Cho | G11C 11/5628 365/185.03 |
| 2009/0141552 A1* | 6/2009 | Sukegawa | G11C 16/0483 365/185.03 |
| 2009/0287975 A1* | 11/2009 | Kim | G11C 11/5628 714/746 |
| 2010/0321998 A1* | 12/2010 | Jang | G11C 11/5628 365/185.03 |
| 2011/0075478 A1* | 3/2011 | Yoon | G06F 11/1072 365/185.03 |
| 2011/0182121 A1* | 7/2011 | Dutta | G11C 11/5628 365/185.09 |
| 2012/0166913 A1* | 6/2012 | Alrod | G11C 11/5642 714/773 |
| 2013/0028021 A1* | 1/2013 | Sharon | G11C 16/3459 365/185.17 |
| 2013/0031430 A1* | 1/2013 | Sharon | G11C 11/5642 714/719 |
| 2015/0149693 A1* | 5/2015 | Ng | G11C 16/10 711/103 |
| 2015/0193302 A1* | 7/2015 | Hyun | G06F 11/108 714/764 |
| 2015/0234706 A1* | 8/2015 | Alrod | G06F 11/076 714/704 |
| 2015/0248326 A1* | 9/2015 | Fitzpatrick | G11C 11/5628 714/6.11 |
| 2015/0357040 A1* | 12/2015 | Hara | G11C 7/1006 365/185.03 |
| 2016/0092299 A1* | 3/2016 | Wakchaure | G06F 11/1068 714/764 |
| 2016/0093390 A1* | 3/2016 | Yuan | G11C 16/10 714/764 |
| 2016/0125951 A1* | 5/2016 | Sun | G11C 29/021 365/185.24 |
| 2016/0218740 A1* | 7/2016 | Parthasarathy | G06F 11/1068 |
| 2016/0299844 A1* | 10/2016 | Sprouse | G06F 11/1048 |
| 2017/0123724 A1* | 5/2017 | Park | G06F 3/0685 |
| 2017/0125111 A1* | 5/2017 | Sankaranarayanan | G11C 16/26 |
| 2017/0293524 A1* | 10/2017 | Jeon | G11C 16/26 |
| 2018/0011753 A1* | 1/2018 | Alhussien | G06F 11/0775 |
| 2018/0040367 A1* | 2/2018 | Wu | G06F 3/0661 |
| 2018/0357013 A1* | 12/2018 | Shi | G06F 3/0659 |
| 2019/0006004 A1* | 1/2019 | Shin | G11C 11/5628 |
| 2019/0250843 A1* | 8/2019 | Ratnam | G11C 29/52 |
| 2019/0278655 A1* | 9/2019 | Koudele | G11C 29/44 |
| 2019/0348130 A1* | 11/2019 | Reuter | G11C 16/34 |
| 2020/0073451 A1* | 3/2020 | Nowell | G06F 1/3296 |
| 2020/0075120 A1* | 3/2020 | Sheperek | G11C 7/1051 |
| 2020/0185034 A1* | 6/2020 | Liikanen | G06F 3/0679 |

OTHER PUBLICATIONS

Micheloni, R. et al., "Inside NAND Flash Memories", DOI 10.1007/978-90-481-9431-5_2, © Springer Science +Business Media B.V. 2010, 36 pages.

Parat, Krishna, NAND Technology, Intel Corporation, Hot Chips Conference, Stanford University, Palo Alto, Ca, Aug. 25, 2013, 18 pages.

Parnell, Thomas, "NAND Flash Basics & Error Characteristics, Why do We Need Smart Controllers?" Flash Memory Summit, Santa Clara, Ca, 2016, 20 pages.

* cited by examiner

MEMORY PROGRAMMING TECHNIQUES

TECHNICAL FIELD

Various examples are described herein that relate to programming memory devices that can store multiple bits per cell.

BACKGROUND

Memory and storage devices are commonly used in computing systems, such as client or cloud computing environments. For example, smart phones, tablet computers, and laptops commonly use memory and storage devices for data storage and retrieval. Servers and data centers in cloud computing or edge computing also use memory and storage devices for data storage and retrieval. Memory and storage devices are advancing in the amount of bits that can be stored per memory cell. However, errors can be introduced in connection with increased amount of bits stored per memory cell.

DETAILED DESCRIPTION

NAND memory devices have the capability to store multiple bits per cell. In connection with programming a cell to store multiple bits, a NAND memory device can perform a check using a pre-read of a previously programmed page and provide the page data to a host for the host to determine if the data was stored correctly with an acceptable bit error rate (BER). For example, for 16 states captured in a quad-level cell (QLC) NAND, a check is performed for each previously programmed page (e.g., 8 states and 2 states). In some cases, a host device can interrupt read-out of previously programmed page(s) (e.g., extra page, top page, and/or lower page), request or perform error correction coding (ECC) based correction and determine if the data has an acceptable bit error rate based on the corrected data. If the bit error rate is acceptable, then the data can be stored back into the NAND memory device. If the bit error rate is not acceptable, then additional extra correction can be added or performed on the pre-read data. However, using this known technique, the host device can be involved in ensuring previously programmed pages have an acceptable error rate and potentially perform remedial actions. The host device is known to perform multiple reads to evaluate the BER conditions, which can add to latency to complete a multiple state programming operation.

Various embodiments provide a manner of programming a cell that stores a single or multiple bits with the same bits and at least one additional bit. For example, if a cell stores M bits, and the cell is to store M+n bits, various embodiments can be used to check the error rates of the M bits prior to storing an additional n bits (where M is 1 or more and n is 1 or more). A determination is made as to the number of threshold voltages present within one or more regions of a distribution of threshold voltages used to erase or program a cell with multiple bits. For example, a distribution of threshold voltage can be used to erase a cell (e.g., 111) and another next higher in magnitude distribution of threshold voltages can be used to program a cell with another state (e.g., 011), and so forth. The number of threshold voltages present within one or more regions can be used to determine or approximate a residual bit error rate (RBER) for the stored M bits (e.g., pages) of data. Based on the number of threshold voltages present within one or more regions being less than a threshold, the M bits and the n bits can be written into the memory cells.

Based on the number of threshold voltages present within one or more regions being equal to or more than the threshold, a page (e.g., extra page) of bits can be read, error corrected, and a bit error rate determined for the error corrected page of bits. If the bit error rate does not exceed a second threshold, then the error corrected page (e.g., extra page) and the remaining bits of the M bits (e.g., lower page, upper page) can be stored along with the n bit(s) (e.g., top page) into the cells. If the bit error rate meets or exceeds the second threshold, then the remaining bits of the M bits (e.g., lower page, upper page) can be error corrected and the error corrected bits (e.g., extra page, lower page, upper page) along with the n bit(s) (e.g., top page) can be stored into the cells.

Determining a number of threshold voltages in one or more regions can be performed by a memory device or its controller. A host device can enable a memory device or its controller to determine a number of threshold voltages in one or more regions using a register, a set feature operation, opcode, and so forth. If the number of threshold voltages present within one or more regions meets or exceeds a threshold, a pass can be indicated. If the number of threshold voltages present within one or more regions is less than a threshold, a fail can be indicated. A host device can read a result of the check (e.g., pass or fail). The host can choose to perform or cause previously stored pages to be read out and error corrected or not based on the pass or fail status.

Figure 1:
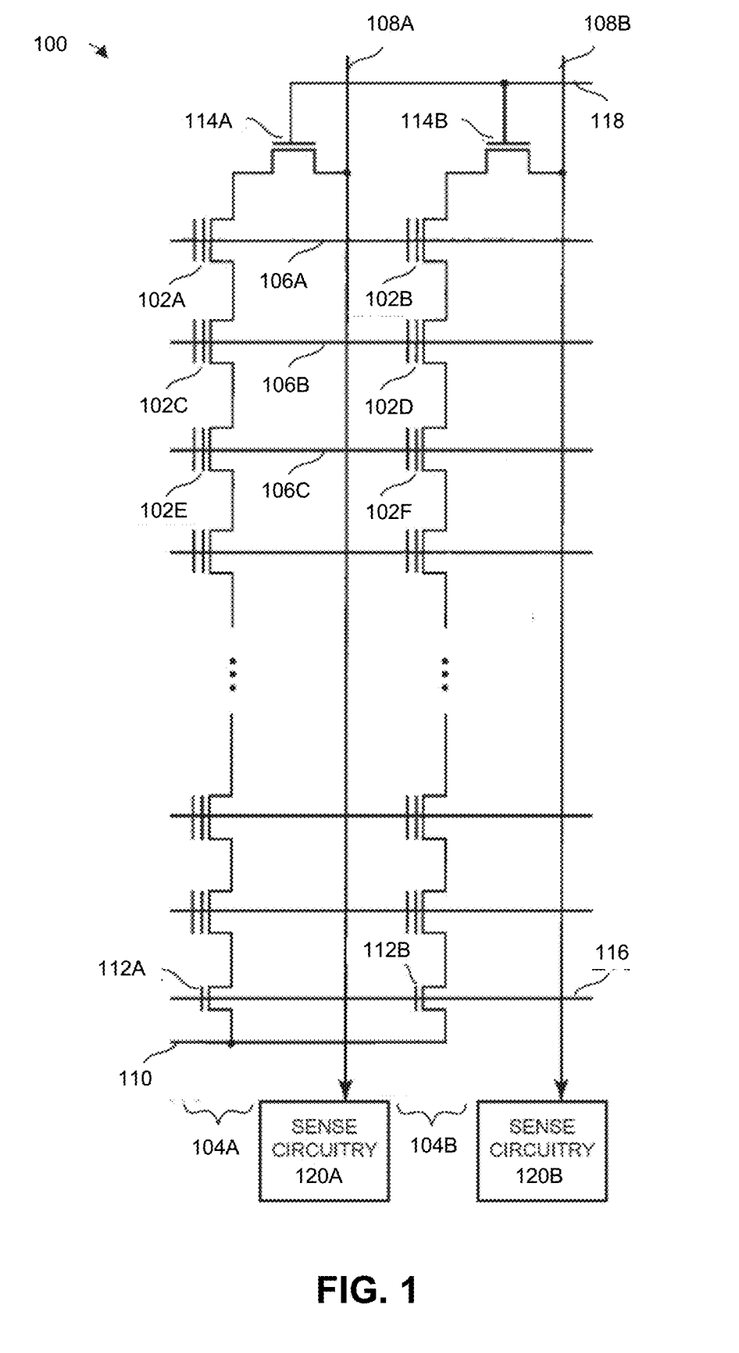
FIG. 1 depicts an example portion of memory in accordance with some embodiments.

FIG. 1 depicts an example portion of a NAND flash memory array 100 in accordance with some embodiments. NAND flash memory array 100 can include a multiple non-volatile memory cells 102 arranged in columns, such as series strings 104. In various embodiments, a memory cell 102 can include a transistor with a floating gate that stores charge indicative of one or more bit values. In series strings 104, drain regions of cells 102 are (with the exception of the top cell) coupled to a source region of another cell 102.

Array 100 also includes wordlines 106. Wordline 106 can span across multiple series strings 104 (e.g., a wordline may be coupled to one memory cell of each series string 104) and are connected to the control gates of each memory cell 102 of a row of the array 100 and used to bias the control gates of the memory cells 102 in the row. Bitlines 108 are each coupled to a series string 104 by a drain select gate 114 and sensing circuitry 120 that detects the state of each cell by sensing voltage or current on a particular bitline 108.

Multiple series strings 104 of memory cells are coupled to a source line 110 by a source select gate 112 and to an individual bitline 108 by a drain select gate 114. The source select gates 112 are controlled by a source select gate control line 116 and the drain select gates 114 are controlled by a drain select gate control line 118.

Figure 3:
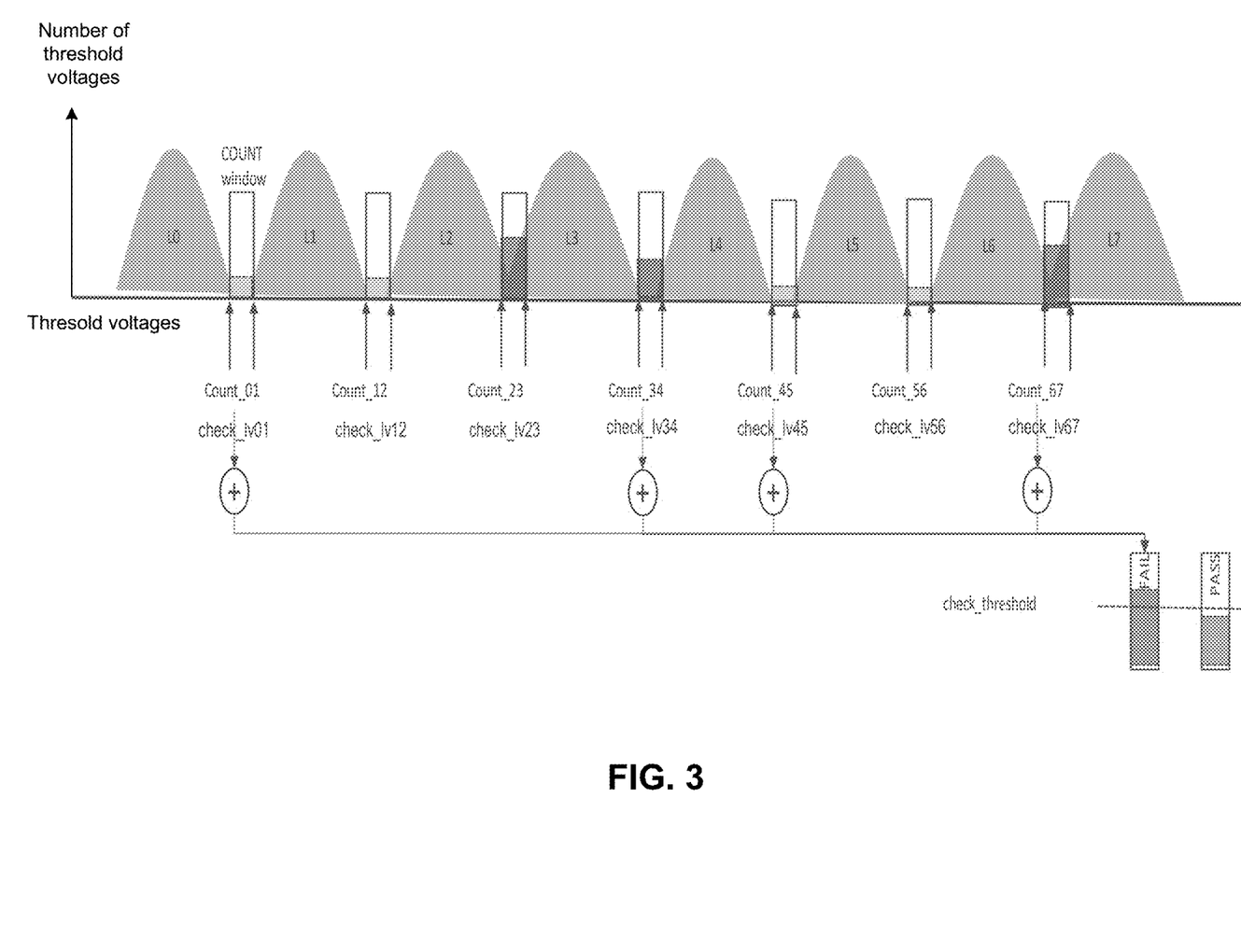
FIG. 3 depicts an example distribution of threshold voltages.

In various embodiments, each memory cell 102 can be programmed according to an SLC, MLC, TLC, a QLC, or other encoding scheme. Each cell's threshold voltage (Vt) is indicative of the data that is stored in the cell. For example, FIG. 3 illustrates example programming of states of NAND flash memory cells 102 for eight states or levels. Level 0 corresponds to an erase state of 111, level 1 corresponds to a first program level of 011. Referring again to FIG. 1, when data (e.g., one or more pages) is written to memory 100, a plurality of the cells may be programmed to a program level.

In various embodiments, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a wordline (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 2:
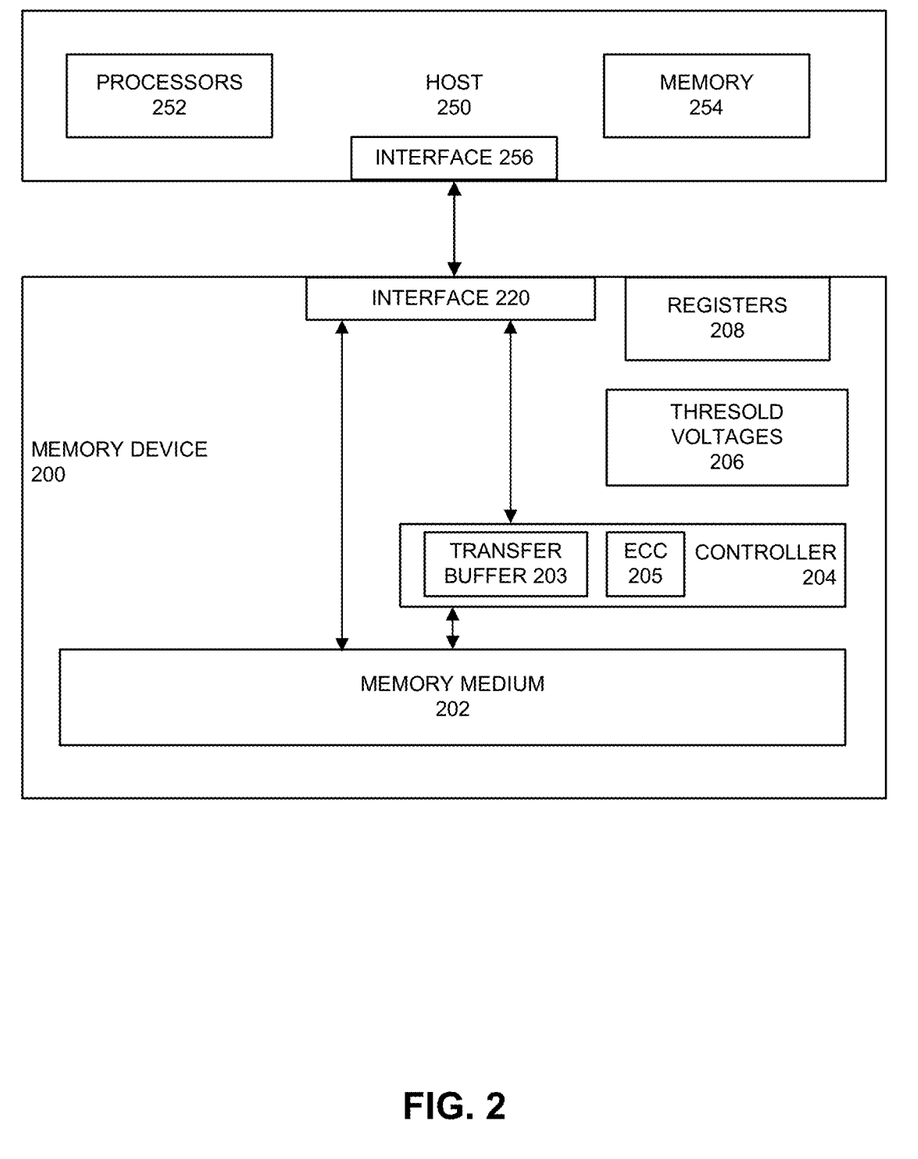
FIG. 2 depicts an example system.

FIG. 2 depicts an example system. Memory device 200 can communicate with host system 250 using respective interfaces 220 and 256. Memory medium 202 can be a memory or storage medium that can store one or more bits in one or more memory cells. For example, memory medium 202 can include non-volatile and/or volatile types of memory. Non-volatile types of memory may be types of memory whose state is determinate even if power is interrupted to the device. In some examples, memory medium 202 can include block addressable memory devices, such as NAND or NOR technologies. Memory medium 202 can also include non-volatile types of memory, such as 3D crosspoint memory (3DxP), or other byte addressable non-volatile memory. Memory medium 202 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 202 can include a single-level cell (SLC) NAND storage device, a multi-level cell (MLC) NAND storage device, triple-level cell (TLC) NAND storage device, quad-level cell (QLC) storage device.

According to some examples, volatile types of memory included in memory medium 202 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

Controller 204 can be coupled with or configured to couple with a computing platform such as host 250 using interface 220. Controller 204 can communicate with elements of the computing platform to read data from memory medium 202 or write data to memory medium 202. Controller 204 can be configured to receive and perform commands from host 250 concerning use of memory medium 202 (e.g., read data, write data, or indicate error rate). Controller 204 can be coupled to word lines of memory medium 202 to select one of the word lines, apply read voltages, apply program voltages combined with bit line potential levels, or apply erase voltages. Controller 204 can be coupled to bit lines of memory medium 202 to read data stored in the memory cells, determine a state of the memory cells during a program operation, and control potential levels of the bit lines to promote or inhibit programming and erasing. Other circuitry can be used for applying selected read voltages and other signals to memory medium 202.

Controller 204 can include or access transfer buffer 203 to perform an error checking and correction of data previously written to memory medium 202. Transfer buffer 203 can be a volatile memory, such as static random access memory (SRAM). Transfer buffer 203 can include some other type of volatile memory that is different from an SRAM. In accordance with an embodiment, transfer buffer 203 usage can be reduced and freed for other uses by releasing transfer buffer 203 following the threshold voltage number check as opposed to holding transfer buffer 203 for an entire program time.

Threshold voltages block 206 can store threshold voltages for cells in memory medium 202 and provide controller 204 with applicable threshold voltages (Vt) to apply to memory cells in memory medium 202 to cause a state of cells to enter one of multiple states. For example, by application of threshold voltages to memory cells in memory medium 202, memory cells are programmed to enter a particular state to store one or more bits or memory cells can be erased.

In some embodiments, prior to programming memory cells to store 4 bits/cell, controller 204 can determine a bit error rate of one or more bits stored in memory cells that store 3 bits/cell. Various embodiments provide for memory device 200 to count the cell threshold voltages in one or more expected valley ranges for use in programming or erasing 3 bits/cell. For example, a bit error rate for the 3 bits/cell can be determined based on a range check including counting a number of threshold voltages in one or more ranges. For example, the one or more ranges can be a range of threshold voltage values between apexes (e.g., peak numbers of cell threshold voltages) for erase or program states. For example, FIG. 3 depicts an example of threshold voltage value distributions for memory cells for 8 erase and programming states (e.g., 3 bits/cell). One or more ranges can be selected between an erase state for level 0 and a program state for level 1, a program state for level 1 and a program state for level 2, and so forth to between a program state for level 6 and a program state for level 7.

A total number of threshold voltages can be a sum of threshold voltages within one or more ranges. For example, the total number can be a first range (e.g., between or among level 0 and level 1) summed with a number of threshold voltages within a second range (e.g., between or among level 3 and level 4) summed with a number of threshold voltages within a third range (e.g., between or among level 4 and level 5) summed with a number of threshold voltages within a fourth range (e.g., between or among level 4 and level 5) and summed with a number of threshold voltages within a fifth range (e.g., between or among level 6 and level 7).

For example, if a total number of threshold voltages in the one or more ranges does not meets and does not exceed a threshold, the previously stored bits for first, second, and third pages (e.g., UP, LP, XP) and the fourth page (e.g., TP) can be written into memory cells.

For example, if a total number of threshold voltages in the one or more ranges meets or exceeds a threshold, the RBER for the three bit/cell storage can be considered to be excessive and corrective action can be taken prior to storing 4 bits/cell. Corrective action can include reading out bits from a first page of memory cells (e.g., XP), performing error correction encoding (e.g., by controller 204 using ECC 205) on the bits of the first page, and determining if the bit error rate of the bits of the first page exceeds a threshold. In some examples, error correction and bit error checking can be performed on other pages than the extra page, for example, upper page or lower page. If the bit error rate does not exceed a threshold, then the error correction coded bits of the first page (e.g., XP) can be written to the cells along with data for a fourth page (e.g., TP) and previously stored bits for second and third pages (e.g., UP and LP).

If the bit error rate exceeds a threshold, then error correction (e.g., using ECC 205) can be applied to bits of the second and third pages of cells (e.g., UP and LP) and the error corrected bits of the first, second, and third pages (e.g., XP, UP, and LP) and a fourth page (e.g., TP) can be provided for storage into cells. Accordingly, storage of a fourth bit in addition to previously stored 3 bits in a cell can be performed while potentially improving the accuracy of the previously stored 3 bits per cell.

Referring to FIG. 2, memory 200 can perform a determination of whether the total number of threshold voltages in one or more regions of the 3 bits/cell does not meet and exceed a threshold (pass) or meets or exceeds a threshold (fail) and report the pass/fail status to host 250.

Host 250 can cause a storage of 4 bits/cell using memory medium 202. Memory medium 202 can be configured to store 4 bits/cell. In connection with the storage of 4 bits/cell, host 250 can cause memory device 200 to verify accuracy and potentially error correct stored 3 bits/cell. For example, host 250 can configure the read voltage window or valley range in which the Vt count operation occurs. Host 250 can enable one or more range checks via registers 208. Based on one or more flags in register 208, memory device 200 can perform a stand-alone measurement of cell Vt within a specific window range or ranges.

Host 250 can configure memory device 200 with a threshold criteria against which Vt counts (sums) are compared to determine a pass/fail state. A threshold count meeting or exceeding a threshold can cause a status register in registers 208 to be set to indicate pass/fail. Multiple ranges can be checked (e.g., up to seven ranges) or added together to check the ranges against a threshold.

Host 250 can be any type of computing platform with processors 252 and memory 254, as well as other components. For example, an application executing on processors 252 can cause a data write to memory device 200. In connection with a 4 bit/cell storage operation, host 250 can initiate an 8 state (e.g., extra page (XP)) threshold voltage single or multiple range check against a configurable threshold. Memory device 200 can provide the pass/fail status in a status register SR[0] among registers 208. Range check can be applied to either or both single plane or multiplane modes. A plane can include multiple blocks, where each block includes multiple pages of storage arrays. In the case of a single plane range check operation, host 250 can provide a particular sequence with an XP page address without any data input. A status register SR[0] can reflect the pass/fail status after completion of the range check. For example, a single plane range check can include one or more of the following:

1. Host 250 enables range check by writing to a latch in memory device 200 with a bit or bits set to enable range check.
2. Host 250 can issue a command to write to an extra page but with no provided data and with an indicator to start a range check operation.
3. Host 250 can wait a time amount of t_valley_chk time or for memory device 200 to indicate a ready state (e.g., range check completed).
4. Memory device 200 can update status register SR[0] with pass/fail status based on results of range check.
5. Host 250 can read the status register SR[0] with pass/fail status based on results of range check.
6. Host 250 disables range check feature by setting a bit or bits to disable range check.

For example, to initiate multiplane range check operation, host 250 can enable range check and provide instructions to write data to extra page (XP) for multiple planes but with no data provided and include an indicator (e.g., 10 h value) to start range check with an instruction for a write to a plane (e.g., Nth plane). Memory device 200 can update the pass/fail status per plane on status register SR[0]. Host 250 can use a read status instruction to obtain the pass/fail status per plane. For example, a multiple plane range check for planes P0 to P3 can include one or more of the following:

1. Host 250 enables range check by writing to a latch in memory device 200 with a bit or bits set to enable range check.
2. Host 250 provides instruction to write to XP of plane P0 but with no data and an indicator to wait (e.g., 11 h).
3. Host 250 waits time amount tDBSY.
4. Host 250 provides instruction to write to XP of plane P1 but with no data and an indicator to wait (e.g., 11 h).
5. Host 250 waits time amount tDBSY.
6. Host 250 provides instruction to write to XP of plane P2 but with no data and an indicator to wait (e.g., 11 h).

7. Host 250 waits time amount tDBSY.
8. Host 250 provides instruction to write to XP of plane P3 but with no data and an indicator to commence range check (e.g., 10 h).
9. Host 250 waits a time amount of t_valley_chk.
10. Memory device 200 updates status register SR[0] with pass/fail status per plane.
11. Host 250 can read the status register SR[0] with pass/fail status based on results of range check.
12. Host 250 disables range check feature by setting a bit or bits to disable range check.

Based on the range check status, host 250 can choose an option to configure the pre-read for the programming memory device 200 with 4 bits/cell. For a range check pass indication at SR[0], host 250 can issue a program instruction with top page data and wait for a time increment for memory device 200 to indicate the program operation has completed. Memory device 200 can store top page with previously stored lower page, upper page, and extra page data into memory medium 202. Host 250 can write to a latch with a particular value to command memory device 200 to perform the operations.

For a range check fail indication at SR[0], host 250 can (1) issue a program instruction with top page data; (2) wait for an increment of time; (3) issue a page read instruction for extra page data; (4) wait for extra page data to be corrected via error correction coding (e.g., controller 204 can perform recovery based on error correction coding); (5) issue a program instruction to write the error corrected extra page data to memory medium 202; and (6) wait for a time increment for memory device 200 to indicate the program operation has completed. Memory device 200 can store top page with error corrected extra page data with previously stored lower page and upper page data into memory medium 202. Host 250 can write to a latch with a particular value to command memory device 200 to perform the operations.

For a range check fail indication at SR[0] together with a bit error rate of the error corrected extra page data exceeding a threshold, host 250 can (1) issue a program instruction with top page data; (2) wait for an increment of time; (3) issue a page read instruction for extra page data; (4) wait for extra page data to be corrected via error correction coding (e.g., controller 204 can perform recovery based on error correction coding); (5) issue a program instruction to write the error corrected extra page data to memory medium 202; (6) issue a page read instruction for upper page data; (7) wait for upper page data to be corrected via error correction coding (e.g., controller 204 can perform recovery based on error correction coding); (8) issue a program instruction to write the error corrected upper page data to memory medium 202; (9) issue a page read instruction for lower page data; (10) wait for lower page data to be corrected via error correction coding (e.g., controller 204 can perform recovery based on error correction coding); (11) issue a program instruction to write the error corrected lower page data to memory medium 202; and (12) wait for a time increment for memory device 200 to indicate the program operation has completed. Memory device 200 can store top page data with error corrected extra page data, error corrected lower page, and error corrected upper page data into memory medium 202. Host 250 can write to a latch with a particular value to command memory device 200 to perform the operations.

To store 4 bits/cell, 2 bits/cell can be written to a cell followed by 3 bits/cell and then 4 bits per cell. For example, to cause memory device 200 to store 16 states (4 bits/cell), host 250 can issue a 2 state programming command(s) (e.g., for lower page), 8 state programming command(s) (e.g., for extra page and upper page), and a 16 state programming command(s) (e.g., for top page and error or non-error corrected versions of extra page, upper page, or lower page data).

In some embodiments, if recovery using error correction coding does not recover data, other techniques can be used to recover data such as use of XOR recovery techniques using data stored in other portions of memory medium 202 or other memory.

FIG. 3 depicts an example distribution of threshold voltages. A horizontal axis represents a magnitude of threshold voltage and a vertical axis represents a number of threshold voltages. The example distributions of threshold voltages are for 3-bit per cell erase or programming (TLC) and represent threshold voltages applied to erase or program cells to eight levels (levels 0 to 7). Level 0 represents an erase state of all 3 bits per cell. Level 1 represents a program state for the extra page (XP) bits and a zero state for upper page (UP) and lower page (LP) bits.

In some cases, if overlap is present between threshold voltage distributions for multiple levels, a bit error rate can be higher and the data stored in the cells can be incorrectly stored or retrieved but with errors. A number of threshold voltages between levels can represent an expected error rate.

In some embodiments, threshold voltages in one or more regions of the distribution of threshold voltages can be counted, where a region represents a range of threshold voltages. For example, a non-limiting example of a range span can be approximately 0-100 mV. A sum of the number of threshold voltages in one or more regions can be determined and the sum can be compared against a check_threshold value. In this example, the regions are between and among level 0 and level 1, between and among level 3 and level 4, between and among level 4 and level 5, and between and among level 6 and level 7. However, different regions can be chosen. In some cases, a single region can be chosen. The check_threshold value can be programmed by a host computer and applied by a memory device or its memory controller. The check_threshold value can be determined based on testing of the memory device to determine acceptable bit error rates corresponding to values of check_threshold. The check_threshold value can be determined based on testing of other implementations of memory device to determine acceptable bit error rates corresponding to values of check_threshold.

A determination of not meeting and not exceeding check_threshold value (pass) or meeting or exceeding check_threshold value (fail) can be indicated to the host computing system using a register value. The host computing system can determine how to instruct the memory device to program 4 bits per cell based on the pass/fail indication.

Figure 4:
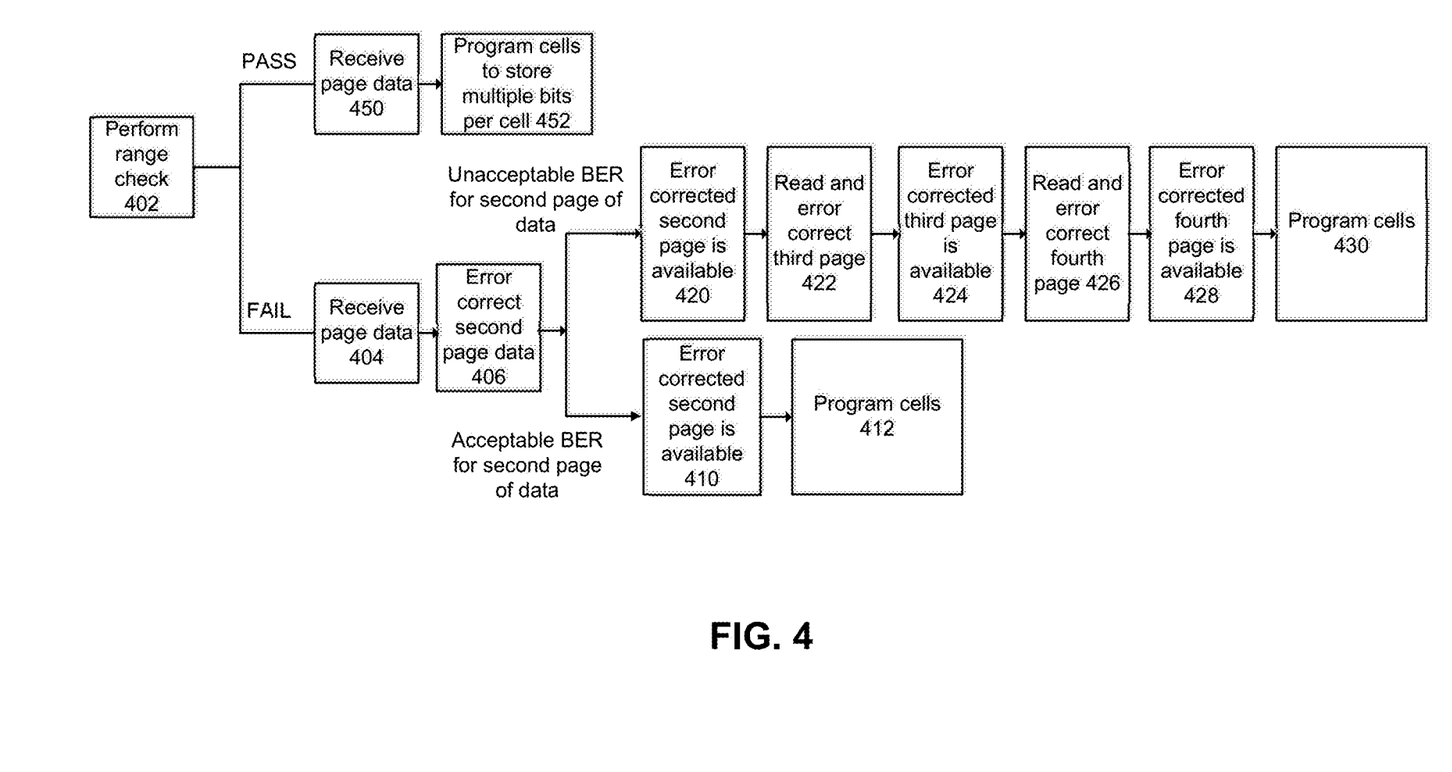
FIG. 4 depicts an example process that can be used prior to programming cells.

FIG. 4 depicts an example process that can be used prior to programming cells with multiple bits per cell. At 402, a range check operation is performed. For example, a memory (e.g., non-volatile or volatile) can perform a range check operation in response to a request from another device (e.g., host). The range check operation can be performed for threshold voltage distributions used to erase or program 8 states (e.g., 3 bits/cell), or fewer or more states. The range check operation can determine a number of threshold voltages in one or more ranges of threshold voltages. If the total number threshold voltages in one or more ranges of threshold voltages does not meet and does not exceed a threshold value, then 450 can follow 402. At 450, a page of data (e.g., top page) can be received from a device (e.g., host). At 452, the page of data can be stored with previously stored pages of data. For example, one or multiple programming passes can be used to store lower page data, upper page data, extra page data, and top page data. A device (e.g., host) can write to a memory device latch to cause the memory device to perform 450 and 452.

If the total number threshold voltages in one or more ranges of threshold voltages meets or exceeds a threshold value, then 404 can follow 402. At 404, a page of data (e.g., top page) can be received from a device (e.g., host). At 406, error correction can be performed on a second page of data (e.g., extra page). If the bit error rate of the second page of data is within an accepted range, then 410 can follow. At 410, the error corrected second page of data is available. Error correction can be performed by the memory device's controller or other device (e.g., host) or software and is made available by transfer or storage in a memory or cache. At 412, one or multiple programming passes can be used to store page of data (e.g., top page), the error corrected second page of data (e.g., extra page), and the lower page data and upper page data. A device (e.g., host) can write to a memory device latch to cause the memory device to perform 410 and 412.

If the bit error rate of the second page of data is not within an accepted range, then 420 can follow. At 420, the error corrected second page of data is available. Error correction can be performed by the memory device's controller or other device (e.g., host) or software and is made available by transfer or storage in a memory. In some cases, a recovery operation can be performed on the second page of data such as XOR data recovery operations in connection with providing an error corrected second page of data. At 422, reading of data and error correction are performed on a third page of data (e.g., upper page). For example, the third page of data can be read using a read operation from the memory device. The read operation can involve reading data and providing the data to a host device for error correction (e.g., ECC). In some examples, the read operation can involve reading data and using a memory controller to perform error correction (e.g., ECC). At 424, the error corrected third page of data is available at the memory device. At 426, reading of data and error correction are performed on a fourth page of data (e.g., lower page). The read operation can involve reading data and providing the data to a host device for error correction (e.g., ECC). In some examples, the read operation can involve reading data and using a memory controller to perform error correction (e.g., ECC). At 428, the error corrected fourth page of data is available. At 430, one or multiple programming passes can be used to store the page of data (e.g., top page), the error corrected second page of data (e.g., extra page), the error corrected third page of data (e.g., lower page), and the error corrected fourth page of data (e.g., upper page). A device (e.g., host) can write to a memory device latch to cause the memory device to perform 420-430.

Figure 5A:
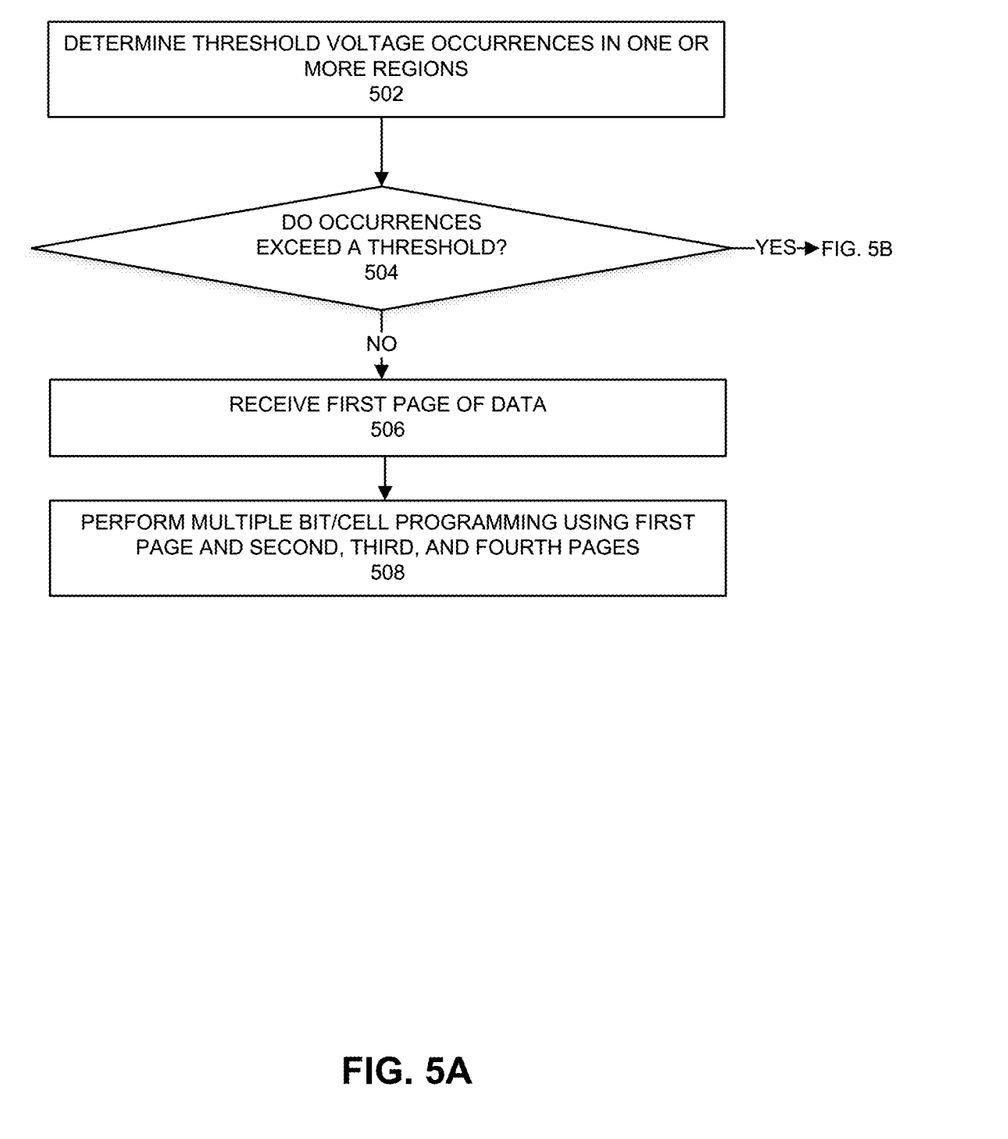
FIGS. 5A-5C depict an example process.
Figure 5B:
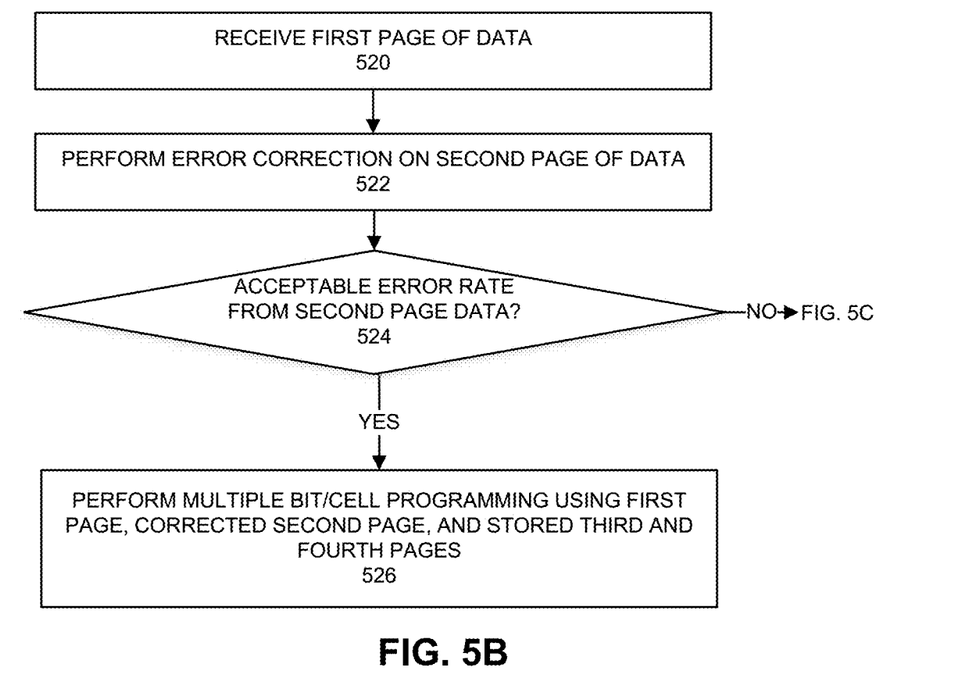

FIGS. 5A-5C depict an example process. At 502, a determination can be made as to a sum of a number of threshold voltages in one or more regions of a threshold voltage distribution for programming or erasing a memory device capable of storing multiple bits per cell. The one or regions can be specified during a test or programming phase of a memory device (e.g., non-volatile memory). A memory device can determine the sum and report the sum via a register or memory region. At 504, a determination is made as to whether the sum meets or exceeds a threshold. In some examples, a memory device can make the determination and indicate whether the threshold is met or exceeded (fail) or not met and not exceeded (pass) using a register. If the sum meets or exceeds a threshold, a process of FIG. 5B can follow. If the sum does not meet and does not exceed a threshold, 506 can follow. At 506, a first page of data can be received at the memory device. For example, the first page of data can be provided by a host device. For example, the first page of data can be top page data for use in 4 bit/cell programming. At 508, the memory device can perform memory cell programming using first page and stored second, third, and fourth page from 3 bits/cell programming (e.g., lower page, extra page, and upper page). The programming of memory cells can occur in response to one or more programming commands from a host device for one or more pages of data.

FIG. 5B depicts an example process. The process of FIG. 5B can be performed in response to a sum of threshold voltages meeting or exceeding a threshold level. At 520, a first page of data can be received by a memory device (e.g., non-volatile memory). For example, the first page of data can be provided by a host device. For example, the first page of data can be top page data for use in 4 bit/cell programming. At 522, error correction can be performed on a second page of data. For example, the host or memory device (e.g., controller) can perform the error correction on the second page of data. The second page of data can be an extra page data stored in a 3 bit/cell state, although other pages can be used (e.g., upper page or lower page).

At 524, a determination can be made as to whether the error rate of the error corrected second page of data is acceptable. If the error rate is acceptable, 526 can follow. At 526, the memory device can program memory cells with multiple bits/cell using first page data (e.g., top page), error corrected second page data (e.g., extra page), and stored third and fourth pages from 3 bits/cell programming (e.g., upper page and lower page).

Figure 5C:
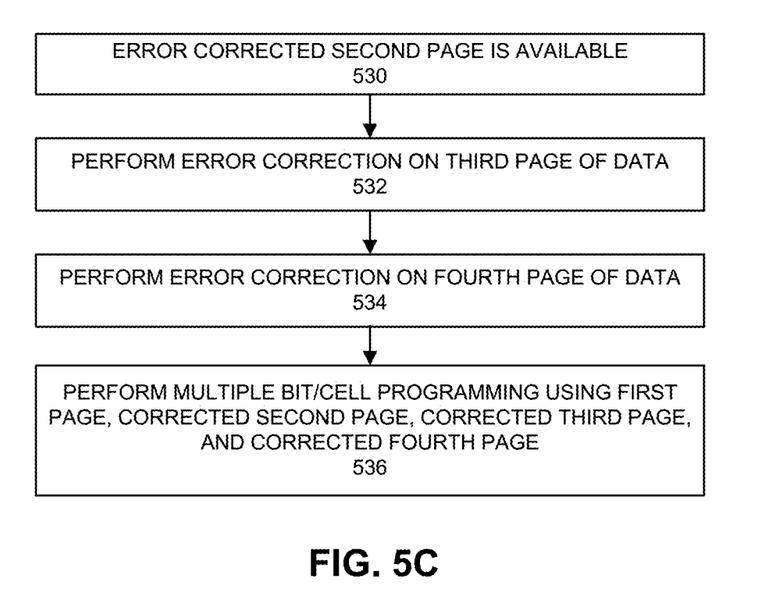

If the error rate is determined at 524 to be not acceptable, the process of FIG. 5C can follow. At 530 of FIG. 5C, the error corrected second page of data is available. For example, the host or memory device (e.g., controller) can perform error correction of the second page of data based on ECC and make it available. At 532, error correction to recover data can be performed on a third page of data. For example, the host or memory device (e.g., controller) can perform error correction of the third page of data based on ECC and make it available. The third page of data can be an upper page of data. At 534, error correction to recover data can be performed on a fourth page of data. For example, the host or memory device (e.g., controller) can perform error correction of the fourth page of data based on ECC and make it available. The fourth page of data can be a lower page of data. At 536, using one or multiple programming passes, the first page and error corrected second, third and fourth pages can be stored in memory cells for 4 bits/cell storage.

Figure 6:
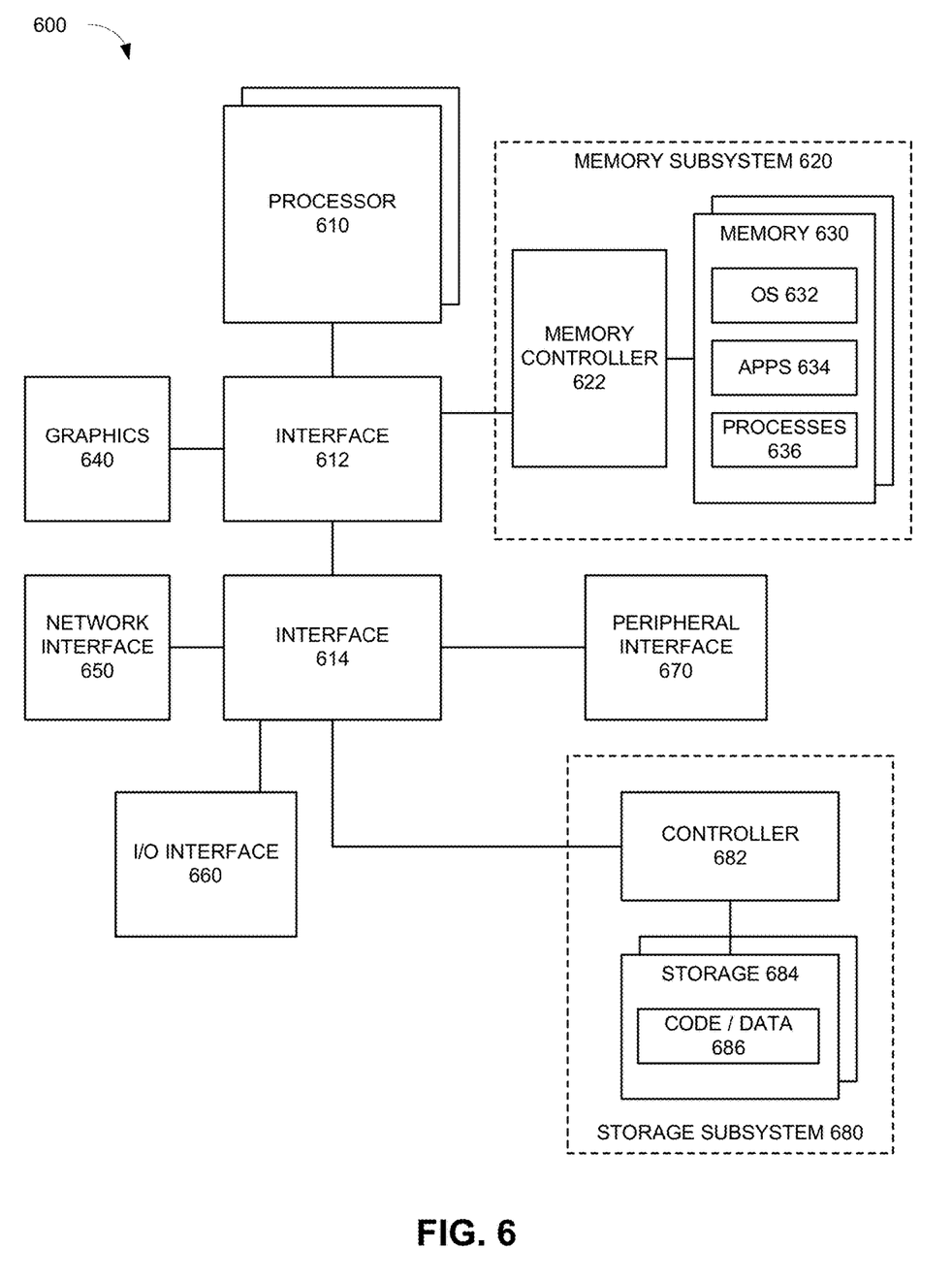
FIG. 6 depicts an example system.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1364 bus.

In one example, system 600 includes interface 614, which can be coupled to interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory.

In one example, system 600 includes one or more input/ output (I/O) interface(s) 660. I/O interface 660 can include one or more interface components through which a user interacts with system 600 (e.g., audio, alphanumeric, tactile/ touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented using interconnected compute sleds of processors, memories, storages, network interfaces, and other components. High speed interconnects can be used such as PCIe, Ethernet, or optical interconnects (or a combination thereof).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed is:

1. A method comprising:
    determining a bit error rate associated with bits stored in a plurality of memory cells, wherein at least a portion of the plurality of memory cells store M bits per cell and wherein M is an integer of 1 or more, wherein the bit error rate is based on a summation of a number of threshold voltages in a region between or among two threshold voltage distributions and
    programming a plurality of memory cells with M+n bits per cell based on the determined bit error rate, wherein n is an integer of 1 or more.

2. The method of claim 1, wherein a memory device performs the determining the bit error rate based on a number of threshold voltages in one or more regions between or among threshold voltage distributions.

3. The method of claim 1, wherein the programming a plurality of memory cells with M+n bits per cell comprises:

in response to the bit error rate being below a threshold, programming the plurality of memory cells based on the n bits per cell and the M or fewer number of pages of data.

4. The method of claim 1, wherein the programming a plurality of memory cells with M+n bits per cell comprises:
in response to the bit error rate being at or above a threshold: performing error correction on M or fewer number of pages of data and programming the plurality of memory cells based on the n bits per cell and the error corrected M or fewer number of pages of data.

5. The method of claim 1, wherein the programming a plurality of memory cells with M+n bits per cell comprises:
in response to the bit error rate being at or above a threshold:
performing error correction on a second page stored by the plurality of memory cells,
determining a second bit error rate of the error corrected second page, and
in response to the second bit error rate of the error corrected second page being less than a second threshold, programming the plurality of memory cells based on the n bits per cell, the error corrected second page, and third and fourth pages stored by the plurality of memory cells.

6. The method of claim 1, wherein the programming a plurality of memory cells with M+n bits per cell comprises:
in response to the bit error rate being at or above a threshold:
performing error correction on a second page stored by the plurality of memory cells,
determining a second bit error rate of the error corrected second page, and
in response to the second bit error rate of the error corrected second page being at or above a second threshold:
performing error correction on a third page stored by the plurality of memory cells,
performing error correction on a fourth page stored by the plurality of memory cells, and
programming the plurality of memory cells based on the n bits per cell, the error corrected second page, the error corrected third page, and the error corrected fourth page.

7. The method of claim 1, wherein the M bits per cell comprise one or more of: extra page, upper page, or lower page.

8. The method of claim 1, wherein the n bits per cell comprises a top page.

9. An apparatus comprising:
registers and
a memory controller communicatively coupled to the registers, the memory controller to:
determine a number of threshold voltages in one or more regions within a distribution of threshold voltages used to program or erase a memory medium, wherein the number of threshold voltages in one or more regions within a distribution of threshold voltages used to program or erase a memory medium comprises a summation of a number of threshold voltages in a region between or among an erase threshold voltage distribution and an adjacent program threshold voltage distribution and a number of threshold voltages in at least one region between or among two or more program threshold voltage distributions,
indicate, in a register, a pass or fail status based on the number of threshold voltages in the one or more regions; and
cause a portion of the memory medium to store multiple pages of data based on received one or more instructions.

10. The apparatus of claim 9, wherein to indicate, in a register, a pass or fail status based on the number of threshold voltages in the one or more regions, the memory controller is to:
indicate a pass status based on a number of threshold voltages in one or more regions not meeting and not exceeding a threshold or
indicate a fail status based on a number of threshold voltages in one or more regions meeting or exceeding the threshold.

11. The apparatus of claim 9, wherein to cause a portion of the memory medium to store multiple pages of data based on a received one or more instructions, the memory controller is to:
perform error correction on a second page of data stored in the memory medium and
based on a bit error rate of the error corrected second page of data not exceeding a second threshold, cause the memory medium to store multiple pages of data using a first page of data, the error corrected second page of data, and third and fourth pages of data, wherein the third and fourth pages of data comprise data stored in the memory medium.

12. The apparatus of claim 9, wherein to cause a portion of a memory medium to store multiple pages of data based on a received one or more instructions, the memory controller is to:
perform error correction on a second page of data stored in the memory medium and
based on a bit error rate of the error corrected second page of data meeting or exceeding a second threshold:
perform error correction on a third page of data stored by the memory medium,
perform error correction on a fourth page of data stored by the memory medium, and
cause the memory medium to store multiple pages of data using a first page of data, the error corrected second page of data, the error corrected third page of data, and the error corrected fourth page of data.

13. The apparatus of claim 9, wherein the cause a portion of a memory medium to store multiple pages of data based on a received one or more instructions comprises storage of one or more of: an extra page, upper page, lower page, or a top page.

14. The apparatus of claim 9, further comprising a memory medium communicatively coupled to the memory controller, wherein the memory medium comprises one or more of: a single-level cell (SLC) NAND storage device, a multi-level cell (MLC) NAND storage device, triple-level cell (TLC) NAND storage device, quad-level cell (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

15. The apparatus of claim 9, further comprising a host device, the host device comprising:
- an interface communicatively coupled to the memory controller and
- at least one processor, the at least one processor to:
  - read the pass or fail status from the register,
  - issue at least one instruction to cause the memory controller to write a page of data together with pages of data stored by the memory medium based on a pass status, and
  - issue at least one instruction to cause the memory controller to perform error correction on at least one page of data stored by the memory medium based on a fail status.

16. A system comprising:
- a computing system comprising a processor and a network interface and
- a memory device communicatively coupled to the computing system, the memory device comprising:
  - a memory medium comprising a plurality of cells and
  - a memory controller to:
    - program a portion of the plurality of cells to store multiple pages of bits,
    - determine a number of threshold voltages in one or more regions associated with the portion of the plurality of cells, wherein the one or more regions comprise a region between or among adjacent threshold voltage distributions,
    - perform error correction on at least one of the pages based on the number of threshold voltages being at or above a threshold, and
    - store multiple pages of bits without error correction based on the number of threshold voltages being below the threshold.

17. The system of claim 16, wherein to perform error correction on at least one of the pages based on the number of threshold voltages being at or above a threshold, the memory controller is to:
- perform error correction on a second page of bits; and
- cause storage of a first page, the error corrected second page of bits, and third and fourth pages of bits in the memory medium.

18. The system of claim 17, wherein the memory controller is to:
- based on a bit error rate of the error corrected second page of bits meeting or exceeding a second threshold:
  - cause error correction on a third page of bits;
  - cause error correction on a fourth page of bits;
  - cause storage of a first page of bits, received from the computing system, into the memory medium;
  - cause storage of the error corrected second page of bits into the memory medium;
  - cause storage of the error corrected third page of bits into the memory medium; and
  - cause storage of the error corrected fourth page of bits into the memory medium.

19. The system of claim 16, wherein the memory medium comprises one or more of: a single-level cell (SLC) NAND storage device, a multi-level cell (MLC) NAND storage device, triple-level cell (TLC) NAND storage device, quad-level cell (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

* * * * *